US006812788B2

United States Patent
Kern

(10) Patent No.: US 6,812,788 B2
(45) Date of Patent: Nov. 2, 2004

(54) AMPLIFYING CIRCUIT

(75) Inventor: Otmar Kern, Berlin (DE)

(73) Assignee: Georg Neumann GmbH, Berlin (DE)

( * ) Notice: Subject to any disclaimer, the term of this patent is extended or adjusted under 35 U.S.C. 154(b) by 0 days.

(21) Appl. No.: 10/472,887

(22) PCT Filed: Mar. 26, 2001

(86) PCT No.: PCT/EP01/03410
§ 371 (c)(1),
(2), (4) Date: Mar. 9, 2004

(87) PCT Pub. No.: WO02/078177

PCT Pub. Date: Oct. 3, 2002

(65) Prior Publication Data

US 2004/0131210 A1 Jul. 8, 2004

(51) Int. Cl.[7] .............................. H03F 3/45; H03F 1/36; H03F 3/04
(52) U.S. Cl. .................... 330/69; 330/110; 330/311
(58) Field of Search ......................... 330/69, 110, 311

(56) References Cited

U.S. PATENT DOCUMENTS

| 3,595,998 A | | 7/1971 | Fidi et al. | |
|---|---|---|---|---|
| 4,629,910 A | * | 12/1986 | Early et al. | 327/530 |
| 5,589,799 A | | 12/1996 | Madaffari et al. | |
| 5,734,725 A | * | 3/1998 | Pritchard | 381/61 |
| 5,912,585 A | * | 6/1999 | Yamada | 330/118 |
| 6,057,737 A | * | 5/2000 | Pritchard | 330/300 |

FOREIGN PATENT DOCUMENTS

EP  0 880 225  11/1998

* cited by examiner

Primary Examiner—Patricia Nguyen
(74) Attorney, Agent, or Firm—Venable LLP; Catherine M. Voorhees

(57) ABSTRACT

In signal sources having a high impedance, typically a capacitive "signal source" such as capacitor-microphone capsules, it is common practice to use amplifier circuits that include means for coupling signals and determining operating points in addition to the actual amplifier having a high-resistance, non-inverting input. For setting the operating points of the signal source and the amplifier, separate bias-voltage sources are provided; these are coupled to the signal source and the non-inverting input, respectively, of the amplifier via a coupling impedance. At least one coupling capacitance is disposed in the signal path between the signal source and the non-inverting input of the amplifier. To attain a considerable noise gain without the disadvantage of very high idle times in this type of amplifier circuit, it is proposed that the coupling impedances be formed from a nonlinear resistance (D1, D2 or D3, D4) and an ohmic resistance (R3 or R4) connected thereto in series. Moreover, the output signal (S2) of the amplifier (IC1) or a signal derived therefrom is fed back to the coupling impedances (D1, D2, R3 or D3, D4, R4) via a second or third coupling capacitance (C3 or C4).

11 Claims, 2 Drawing Sheets

AMPLIFYING CIRCUIT

BACKGROUND OF THE INVENTION

The invention relates to an amplifier circuit for audio-frequency signals. An amplifier circuit of this type is known from U.S. Pat. No. 3,595,998 A.

Usually, high-resistive resistances are used for setting the operating point at high-resistance amplifier inputs, and for bias-voltage coupling to capacitive signal sources. FIG. 1 illustrates a corresponding circuit arrangement in accordance with the prior art. Here, C1 represents a capacitive signal source of 50 pF in the form of a capacitor-microphone capsule, which is coupled to a DC supply Vbias1 of +60 V via a high-resistive resistance R1 of 3 GOhms. The useful signal S1 of the capacitive signal source C1, for example an audio signal, is supplied to the high-resistance, non-inverting input (+) of an amplifier IC1 via a series-coupling capacitance C2 of 1 nF (which is inserted into the signal path for separating the operating-point voltages). The output signal S2 of the amplifier IC1 is fed back to the inverting input (−) of the amplifier IC1 in the manner of negative feedback. In terms of the signal voltage, this results in an amplification of V=1, making available the output signal S2 with a low source impedance, which carries the same useful-signal information as the signal S1 with respect to value and phase. A bias source Vbias2 of +5 V, which is coupled to the non-inverting input (+) of the amplifier IC1 via a high-resistance resistance R2 of 3 GOhms, is provided for setting the operating point of the amplifier IC1.

A circuit arrangement similar to the one in FIG. 1 is known from U.S. Pat. No. 3,595,998 A. This known amplifier circuit like wise has a capacitor-microphone capsule M as the capacitive voltage source; its operating point is determined by an ohmic resistance $R_V$, which is connected to a first bias-voltage source $U_P$. To effect a decoupling between the first bias-voltage source $U_P$ and a second bias-voltage source $U_B$ in order to set the operating point of the downstream amplifier, a coupling capacitance $C_K$ is disposed in the signal path between the capacitor-microphone capsule M and the gate electrode 3 of the amplifier FET. The operating point of the amplifier transistor is determined by a resistance-divider network comprising the ohmic resistances $R_1$, $R_2$, $R_3$, $R_V$ and a diode D. Power-supply voltages of arbitrary polarity can be used for the bias-voltage source $U_B$, because field-effect transistors generally have a symmetrical construction, so the source and drain electrodes exchange functions depending on the applied voltage—that is, the respective electrode having the more negative voltage (in an N-channel model) assumes the role of the source. The output signal is obtained symmetrically in the same manner at the source and drain electrodes by the components $R_4$, $R_5$, C and Tr. Only the operating voltage at the gate electrode must be adapted as a function of the polarity of the power-supply voltage, because the operating voltage does not generally correspond to one-half the power-supply voltage. This is effected by the diode D in series with the resistance $R_2$. In the event of a negative supply voltage, the operating point for the amplifier FET is produced by the voltage divider R1/R3. In this instance, the diode D is blocked and ineffective. In the case of a positive power-supply voltage, an inverted-voltage-divider ratio is necessary. This is accomplished by making the diode D conductive and connecting the resistance R2 in parallel to the resistance R3.

The minimal value of the coupling resistances R1, R2 or $R_V$ that is theoretically necessary results from the desired lower limit frequency of the useful signal S1 to be transmitted. For example, with a lower limit frequency of 20 Hz and a signal-source capacitance of 50 pF, the resulting value of the coupling resistances R1, R2 or $R_V$, which operate in parallel with respect to the load of the signal source C1, or $R_V$ (and whose parallel switching is effective as a load of the signal source) would be 160 MOhms. This type of resistance value generates a very high noise voltage, which is, however, reduced to the ratio of the resistance value of the parallel circuit comprising the two coupling resistances R1, R2 or $R_V$ to the value of the impedance of the capacitive signal source, corresponding to the voltage division. It is also the case that, when the resistance value of the parallel circuit comprising the resistances R1, R2 or $R_V$ is increased by a specific factor, the noise voltage is further reduced by this factor; in contrast, the noise voltage generated in the parallel resistances R1, R2 or $R_V$ only increases by the root of the named factor, in accordance with known laws of physics. With respect to calculations, this means that a noise gain of 3 dB is attained with each doubling of the resistance value.

Unfortunately, this increase in resistance is associated with a considerable drawback: The time that passes from the switching of the operating voltages Vbias 1 and Vbias 2 (switch-on of device), or the switching of the bias voltage Vbias1 to the capacitive signal source for loading the source capacitance and the necessary coupling capacitance, also increases linearly. It is common practice to use resistance values of 1 to 3 GOhms. In conventional microphones, the resulting load times or idle times are in a range of 10 to 15 seconds; in microphones having analog-digital conversion, they can be more than 30 seconds because of increased operating-point requirements. Nevertheless, a further increase in the resistance value with the goal of a noise gain would be desirable, because an extensive overlap by other noise sources does not take place until about 10 to 20 GOhms. It is also to be anticipated that, in the case of a further increase in the resistance value for R1, R2 or $R_V$, in practice the coupled operating-point voltages become increasingly imprecise at the signal source or the non-inverting input (+) of the amplifier because of increasingly frequent, unavoidable leakage currents.

It is further known from EP 0 880 225 A2 to feed the output signal of the amplifier back to the connecting point of a series connection comprising a high-resistive series resistance of two antiparallel diodes, the connection being provided for setting the operating point of the amplifier. In the cited reference, this feedback is accomplished by the fact that virtually no differential voltage results at the two ends of the antiparallel diodes (FIGS. 2 through 5), so the detrimental capacitance parallel to the diodes remains ineffective. In the circuit according to EP 0 880 225 A2, the operating point of the signal source is not set by way of a separate bias-voltage source, so no coupling capacitance is present in the signal path between the signal source and the amplifier. In this known circuit, therefore, there is no issue of the shortest possible charging time because of the absent coupling capacitance.

The same can be said for the amplifier circuit according to U.S. Pat. No. 5,589,799 A, in which there is also no biased microphone capsule as a signal source, and thus also no coupling capacitance in the signal path between the signal source and the amplifier.

It is the object of the invention to attain a considerable noise gain in an amplifier circuit of the type mentioned at the outset, without having to allow for the disadvantages of very high idle times and an excessive influence of leakage currents. Advantageous embodiments and modifications of the amplifier circuit according to the invention ensue from the dependent claims.

The invention is based on the consideration of replacing the coupling resistances R1, R2 with a network comprising the series connection of a nonlinear resistance and a high-resistive coupling resistance. The coupling resistance that determines the load times of the source capacitance and the coupling capacitance C2 can have relatively small dimensions, because the nonlinear resistance is conductive with a low impedance during the load times, and after the charging of the source capacitance and the coupling capacitance, the resistance automatically assumes a high resistance value that is necessary for improving the noise performance.

BRIEF DESCRIPTION OF THE DRAWINGS

The invention is described in detail in conjunction with FIGS. 2 through 5. Shown are in.

DETAILED DESCRIPTION OF THE INVENTION

Figure 1:
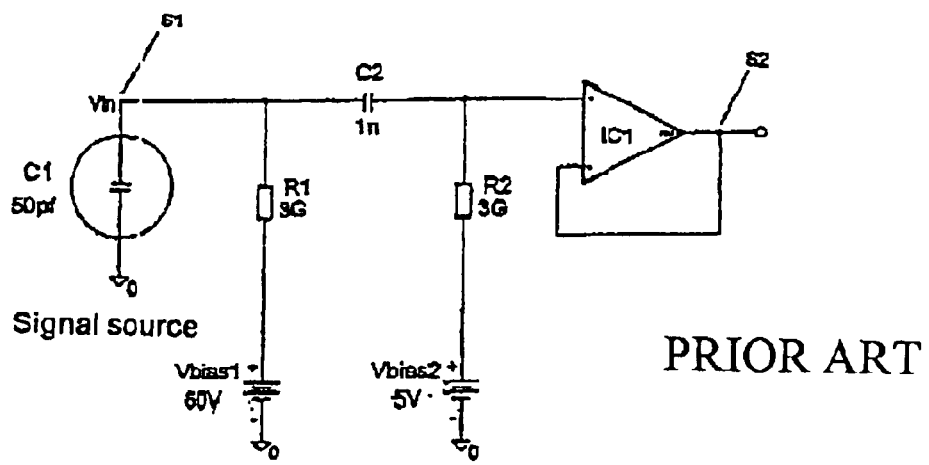
FIG. 1 is a schematic diagram of an amplifier circuit in accordance with the prior art.
Figure 2:
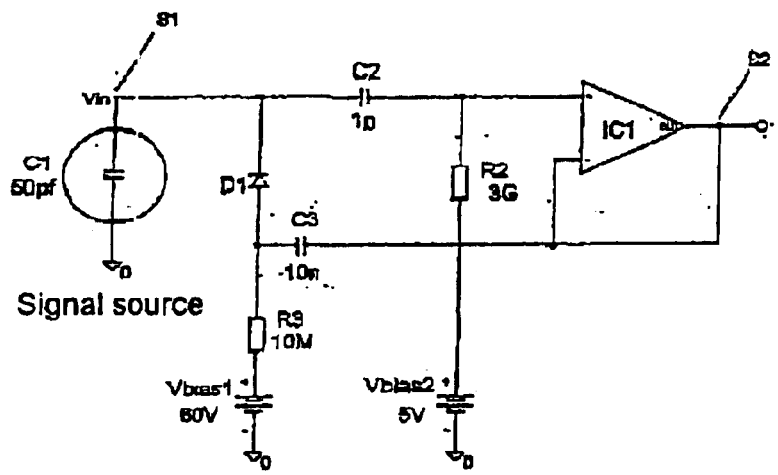
FIG. 2 an electrical, basic circuit diagram of an amplifier circuit according to the invention.

In the basic circuit diagram shown in FIG. 2, in comparison to the prior art illustrated in FIG. 1, the coupling resistance R1 is replaced by the series connection of a nonlinear resistance in the form of a diode D1 and a high-resistive resistance R3. With this measure, the bias voltage Vbias1 is supplied via the component D1, which has a nonlinear current-voltage characteristic and is connected in series with the resistance R3. After the capacitances C1 and C2 have been charged or recharged, virtually no more current flows, so the diode D1 is in the blocked state because no voltage is present between the two terminal ends of the diode D1. The noise voltage generated in the diode D1 is therefore very small, and is based on small, unavoidable leakage currents in the whole circuit. In contrast, during the charging of the capacitances C1, C2, the diode D1 becomes conductive, and the loading currents and times are determined by the ohmic resistance R3 connected in series, the resistance having a resistance value of only 10 MOhms, which is lower than the coupling resistance R1 according to FIG. 1 by a factor of 300.

Without any further measures, the conductive state of the diode D1 would also be caused by the applied AC-voltage useful signal S1 because of the diode's current-voltage characteristic in the pass range. This would cause a detrimental, and nonlinear, load of the capacitive signal source C1, because the source has a very high impedance. The diode D1 would also at least partially transmit the noise voltage generated in the coupling resistance.

To completely prevent these undesired effects, a capacitance C3 is provided, which feeds the impedance-converted useful signal S2 from the output of the amplifier IC1 (whose signal amplification is set at V=1) back to the connecting point between the diode D1 and the resistance R3. The consequence of this feedback is that the useful signal S2 is identical in phase and value at both ends of the diode D1, so the diode D1 is permanently held in the no-voltage, or blocked, state, completely independently of the amplitude of the useful signal S2. This results in an extremely high-resistant and low-noise supply of the operating voltage Vbias1 to the signal source C1. In contrast, the diode D1 is conductive when the capacitances C1, C2 are recharged. The recharging time is determined solely by the time constant R3/C2, which is very small in comparison to the prior art illustrated in FIG. 1. The dimensioning of the time constant R3/C2 depends on the desired lower limit frequency at which the described feedback of the useful signal S2 is still adequately effective. A selected limit frequency of, for example, one-tenth of the lowest useful frequency to be transmitted (in audio signals, generally 20 Hz) fulfills this condition without limitation. Moreover, the capacitor C3 functions such that the noise voltage generated by the coupling resistance is short-circuited to the output of the amplifier IC1, and therefore no longer appears detrimental.

It may happen in practice that the bias voltage Vbias1 of the signal source C1 varies during operation, for example for the purpose of changing the sensitivity or the directional characteristic in a microphone capsule. In this connection, the described operational mechanism is not only significant with respect to charging the capacitances C1, C2 after the bias voltage Vbias1 has been switched on, but also for the accelerated discharge when a smaller, or even negative, bias voltage Vbias1 is to be set. In this case, as shown in FIG. 3, a further diode D2 is in an antiparallel connection with the diode D1, so the described charging processes can take place in bipolar fashion.

Figure 3:
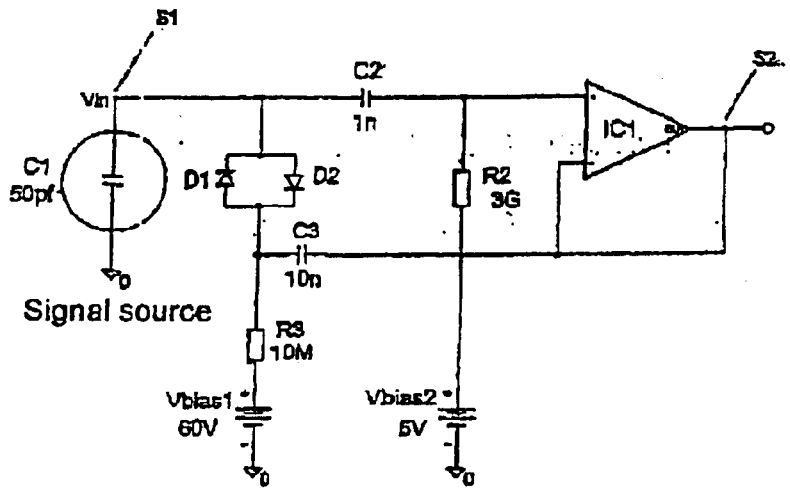
FIG. 3 a further electrical, basic circuit diagram of an amplifier circuit according to the invention.
Figure 4:
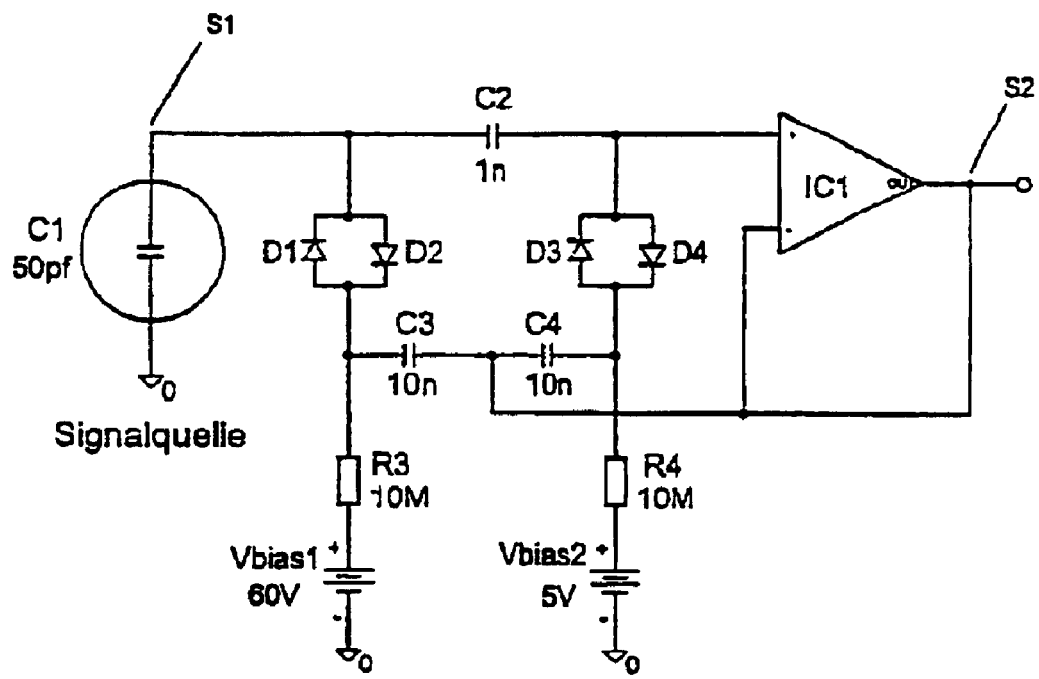
FIG. 4 a circuit diagram of a preferred embodiment of an amplifier circuit according to the invention.

The inventive measures explained in FIGS. 2 and 3 can also be used for setting the operating point of the amplifier or the impedance converter IC1. For this purpose, as shown in FIG. 4, the coupling resistance R2 in accordance with FIG. 1 is replaced by a network comprising the components R4, C4, D3 and D4. This network, again, comprises a series connection of two antiparallel diodes D3, D4, and an ohmic coupling resistance R4 associated with them in series, as well as a coupling capacitance C4 for feeding the useful signal S2 back to the connecting point between the resistance R4 and the diodes D3, D4. The operational mechanism described in conjunction with FIG. 3 is thus effected similarly to that of the amplifier IC1.

Figure 5:
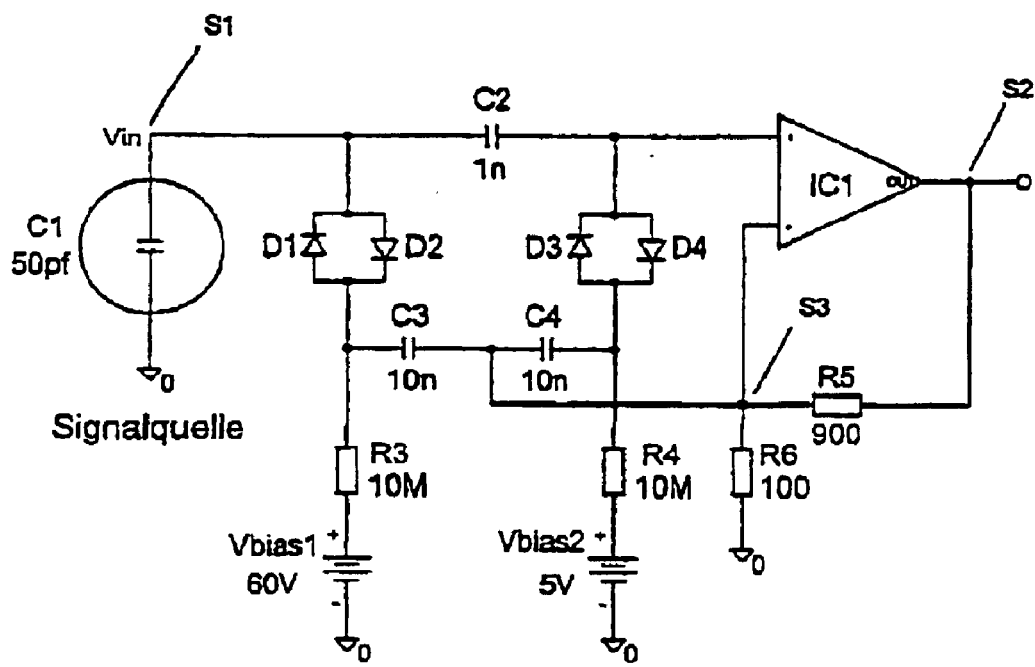
FIG. 5 an electrical circuit diagram of a further preferred embodiment of an amplifier circuit according to the invention.

In the event that the useful-signal amplification of the amplifier IC1 is to be greater than 1, the embodiment according to FIG. 5 should be used; here, the output signal S2 fed back to the inverting input (−) of the amplifier IC1 in the sense of reverse feedback is divided by a resistance divider comprising the ohmic resistances R5, R6. For example, with a division ratio of 10:1, the resulting signal amplification is V=10, because a signal S3 that is identical in value and phase (compared to the useful signal S1 at the non-inverting input (+) of the amplifier ICI) is always established at the inverting input (−) of the amplifier IC1. In the exemplary embodiment according to FIG. 5, for feeding the signal back to the base of the capacitances C3 and C4, it is not the output signal S2 that is used, but the signal S3, which is derived from the output signal, namely divided by the division ratio R5/R6.

Of course, components having a nonlinear current-voltage characteristic can be used instead of the diodes D1 through D4, such as LEDs, Zener diodes, etc.

In practice, the amplifier circuit embodied in accordance with the invention is used to attain a signal-noise ratio that is improved by 2 to 10 dB, depending on the selected evaluation curve for measuring the noise signal. At the same time, the undesired charging and recharging times are reduced to less than one second.

What is claimed is:

1. An amplifier circuit for audio-frequency signals, comprising:

a capacitive voltage source coupled to a first bias-voltage source via a first coupling impedance network to determine an operating point of an amplifier;

said amplifier being coupled by its non-inverting input to a second bias-voltage source via a second coupling impedance network to determine the operating point of said amplifier, said amplifier having an output signal; and a coupling capacitance disposed in the signal path between the capacitive voltage source and the amplifier, wherein the first and second coupling impedance networks respectively comprise a series connection of at least one nonlinear resistance component and a first ohmic resistance or second ohmic resistance having a relatively low resistance value, so that the nonlinear resistance in the signal path between the capacitive voltage source and the amplifier is conductive during the charging times of the capacitance of said capacitive voltage source and the coupling capacitance, the charging times being determined by the first or second ohmic resistance with the nonlinear resistance of each coupling impedance network assuming a high resistance value after each charging of the capacitance of the capacitive voltage source and the coupling capacitance in the signal path between the capacitive voltage source and the amplifier, so the nonlinear resistance only generates a very small noise voltage in each coupling impedance network, and the output signal of the amplifier or a signal derived therefrom is fed back to the first and second coupling impedance networks.

2. The amplifier circuit according to claim 1, wherein the capacitive signal source comprises a capacitor-microphone capsule.

3. The amplifier circuit according to claim 1, wherein the nonlinear resistance component of the first and second coupling impedance networks comprise a diode.

4. The amplifier circuit according to claim 1, wherein the nonlinear resistance component of the first and second coupling impedance networks comprise an antiparallel connection of two diodes.

5. The amplifier circuit according to claim 3, wherein the nonlinear resistance component of the first and second coupling impedance networks comprise an antiparallel connection of two diodes.

6. The amplifier circuit according to claim 1, wherein the output signal of the amplifier is fed back to the inverting input (−) of the amplifier, and to the first and second coupling impedance networks via a second coupling capacitance and a third coupling capacitance, with the full value of its amplitude.

7. The amplifier circuit according to claim 3, wherein the output signal of the amplifier is fed back to the inverting input (−) of the amplifier, and to the first and second coupling impedance networks via a second coupling capacitance and a third coupling capacitance, with the full value of its amplitude.

8. The amplifier circuit according to claim 4, wherein the output signal of the amplifier is fed back to the inverting input (−) of the amplifier, and to the first and second coupling impedance networks via a second coupling capacitance and a third coupling capacitance, with the full value of its amplitude.

9. The amplifier circuit according to claim 1, wherein the output signal of the amplifier is fed back to the inverting input (−) of the amplifier, and to the first and second coupling impedance networks via a second coupling capacitance and a third coupling capacitance, with a partial value of its amplitude.

10. The amplifier circuit according to claim 3, wherein the output signal of the amplifier is fed back to the inverting input (−) of the amplifier, and to the first and second coupling impedance networks via a second coupling capacitance and a third coupling capacitance, with a partial value of its amplitude.

11. The amplifier circuit according to claim 4, wherein the output signal of the amplifier is fed back to the inverting input (−) of the amplifier, and to the first and second coupling impedance networks via a second coupling capacitance and a third coupling capacitance, with a partial value of its amplitude.

* * * * *